United States Patent
Oak et al.

(10) Patent No.: US 10,566,035 B2
(45) Date of Patent: Feb. 18, 2020

(54) SENSE AMPLIFIER AND SEMICONDUCTOR MEMORY APPARATUS USING THE SENSE AMPLIFIER

(71) Applicant: SK hynix Inc., Icheon-si, Gyeonggi-do (KR)

(72) Inventors: Seung Han Oak, Seongnam-si (KR); Sang Hyun Ku, Gwangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/201,426

(22) Filed: Nov. 27, 2018

(65) Prior Publication Data
US 2019/0287578 A1 Sep. 19, 2019

(30) Foreign Application Priority Data
Mar. 16, 2018 (KR) .................. 10-2018-0030758

(51) Int. Cl.
*G11C 7/06* (2006.01)
*G11C 7/08* (2006.01)

(52) U.S. Cl.
CPC ............... *G11C 7/065* (2013.01); *G11C 7/08* (2013.01)

(58) Field of Classification Search
CPC .................................. G11C 7/065; G11C 7/08
See application file for complete search history.

(56) References Cited

U.S. PATENT DOCUMENTS

| 7,046,045 B2* | 5/2006 | Nakazato | H03F 3/45188 327/55 |
| 7,263,016 B1* | 8/2007 | Palumbo | G11C 7/065 327/57 |
| 8,570,823 B2* | 10/2013 | Chen | G11C 7/065 365/185.04 |
| 10,242,720 B2* | 3/2019 | Chen | G11C 7/00 |
| 2005/0264323 A1* | 12/2005 | Nakazato | H03F 3/45188 327/51 |
| 2011/0199847 A1* | 8/2011 | Chen | G11C 7/065 365/205 |
| 2011/0235449 A1* | 9/2011 | Chen | G11C 7/00 365/207 |

FOREIGN PATENT DOCUMENTS

KR 101143471 B1 5/2012

* cited by examiner

*Primary Examiner* — Hoai V Ho
*Assistant Examiner* — Jay W. Radke
(74) *Attorney, Agent, or Firm* — William Park & Associates Ltd.

(57) ABSTRACT

A sense amplifier includes a latch type sense unit that detects a voltage difference between a bit line and a bit line bar and causes a voltage difference between a first latch output node and a second latch output node. The sense amplifier further includes a first latch connection unit that electrically connects the bit line to and disconnects the bit line from the first latch output node.

18 Claims, 3 Drawing Sheets

SENSE AMPLIFIER AND SEMICONDUCTOR MEMORY APPARATUS USING THE SENSE AMPLIFIER

CROSS-REFERENCES TO RELATED APPLICATION

The present application claims priority under 35 U.S.C. § 119(a) to Korean application number 10-2018-0030758, filed on Mar. 16, 2018, in the Korean Intellectual Property Office, which is incorporated herein by reference in its entirety.

BACKGROUND

1. Technical Field

Various embodiments generally relate to a semiconductor integrated circuit, and, more particularly, to a sense amplifier and a semiconductor memory apparatus using the sense amplifier.

2. Related Art

A semiconductor memory apparatus is configured to store data and output the stored data.

The semiconductor memory apparatus is configured to include memory cells that store data. Furthermore, the semiconductor memory apparatus includes a sense amplifier that senses and amplifies the data of the memory cells when the data stored in the memory cells is outputted.

SUMMARY

In an embodiment, a sense amplifier includes a latch type sense unit that detects a voltage difference between a bit line and a bit line bar and causes a voltage difference between a first latch output node and a second latch output node. The sense amplifier further includes a first latch connection unit that electrically connects the bit line to and disconnects the bit line from the first latch output node.

In an embodiment, a semiconductor memory apparatus includes a sense amplifier configured to detect a voltage level of a bit line according to a latch control signal and configured to amplify and substantially maintain the voltage level of the bit line or to substantially prevent the voltage level of the bit line from being amplified and substantially maintained. The semiconductor memory apparatus further includes a latch control signal generation circuit configured to generate the latch control signal in response to a column selection signal and a write signal.

DETAILED DESCRIPTION

A sense amplifier and a semiconductor memory apparatus using the same are described below with reference to the accompanying drawings through various examples of embodiments.

Figure 1:
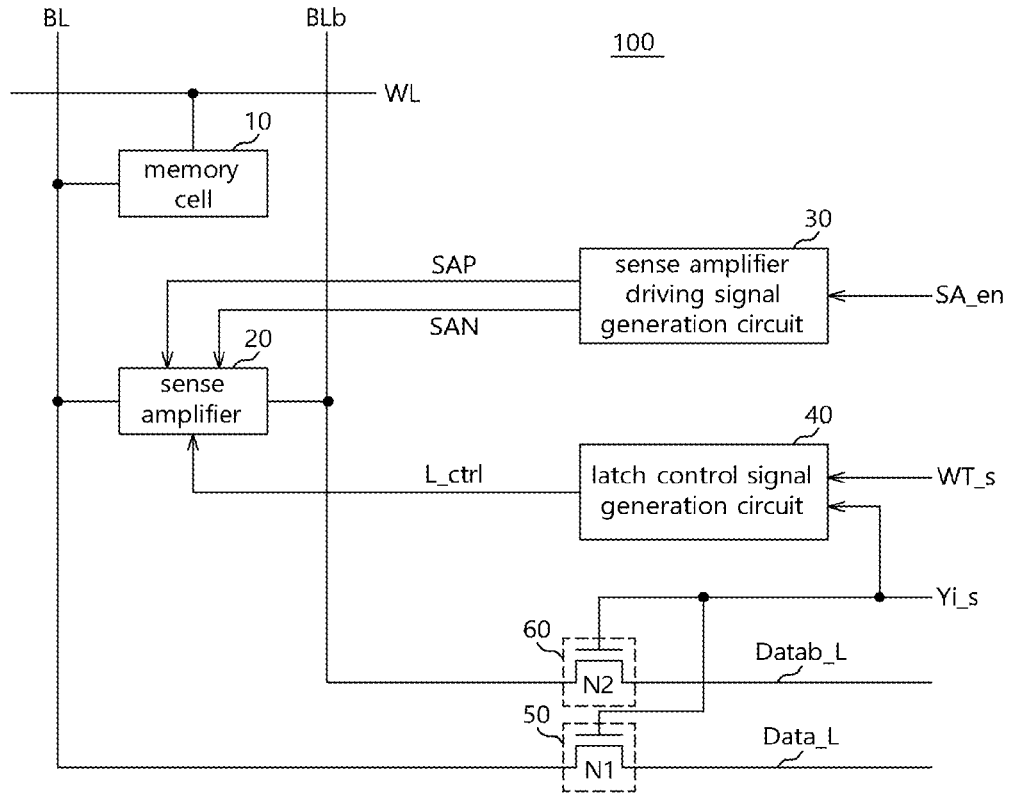
FIG. 1 shows a configuration diagram of a semiconductor memory apparatus, in accordance with an embodiment.

Referring to FIG. 1, a semiconductor memory apparatus 100 in accordance with an embodiment may include a memory cell 10, a sense amplifier 20, a sense amplifier driving signal generation circuit 30, a latch control signal generation circuit 40, and first and second line connection switches 50 and 60.

The memory cell 10 may store data and is electrically connected to a word line WL and a bit line BL. When the word line WL is enabled, the memory cell 10 may transfer data to the bit line BL or receive data from the bit line BL.

The sense amplifier 20 may sense and amplify data, which is transferred from the bit line BL and a bit line bar BLb, in response to a first sense amplifier driving signal SAP, a second sense amplifier driving signal SAN, and a latch control signal L_ctrl. For example, when the first and second sense amplifier driving signals SAP and SAN are enabled, the sense amplifier 20 senses and amplifies a voltage level difference between the bit line BL and the bit line bar BLb. When the latch control signal L_ctrl is disabled, the sense amplifier 20 transfers the amplified voltage level to the bit line BL and the bit line bar BLb and substantially maintains the voltage level transferred to the bit line BL and the bit line bar BLb. During an enable period of the latch control signal L_ctrl, the sense amplifier 20 does not transfer the amplified voltage level to the bit line BL and the bit line bar BLb.

The sense amplifier driving signal generation circuit 30 may generate the first and second sense amplifier driving signals SAP and SAN in response to a sense amplifier enable signal SA_en. For example, when the sense amplifier enable signal SA_en is enabled, the sense amplifier driving signal generation circuit 30 enables the first and second sense amplifier driving signals SAP and SAN.

The latch control signal generation circuit 40 may generate the latch control signal L_ctrl in response to a write signal WT_s and a column selection signal Yi_s. For example, when the write signal WT_s is disabled, the latch control signal generation circuit 40 disables the latch control signal L_ctrl regardless of the column selection signal Yi_s. When the write signal WT_s is enabled, the latch control signal generation circuit 40 enables the latch control signal L_ctrl in response to the column selection signal Yi_s. In more detail, in a state in which the write signal WT_s has been enabled, when the column selection signal Yi_s is enabled, the latch control signal generation circuit 40 enables the latch control signal L_ctrl.

The first line connection switch 50 may electrically connect or disconnect the bit line BL and a data line Data_L to/from each other in response to the column selection signal Yi_s. For example, when the column selection signal Yi_s is enabled, the first line connection switch 50 electrically connects the bit line BL and the data line Data_L to each other. When the column selection signal Yi_s is disabled, the first line connection switch 50 disconnects the bit line BL and the data line Data_L from each other.

The first line connection switch 50 may include a first transistor N1. The first transistor N1 receives the column selection signal Yi_s through a gate thereof, and the bit line BL and the data line Data_L are electrically connected to a drain and a source thereof.

The second line connection switch 60 may include a second transistor N2. The second line connection switch 60 may electrically connect or disconnect the bit line bar BLb and a data line bar Datab_L to/from each other in response to the column selection signal Yi_s. For example, when the column selection signal Yi_s is enabled, the second line connection switch 60 electrically connects the bit line bar BLb and the data line bar Datab_L to each other. When the column selection signal Yi_s is disabled, the second line connection switch 60 disconnects the bit line bar BLb and the data line bar Datab_L from each other.

Figure 2:
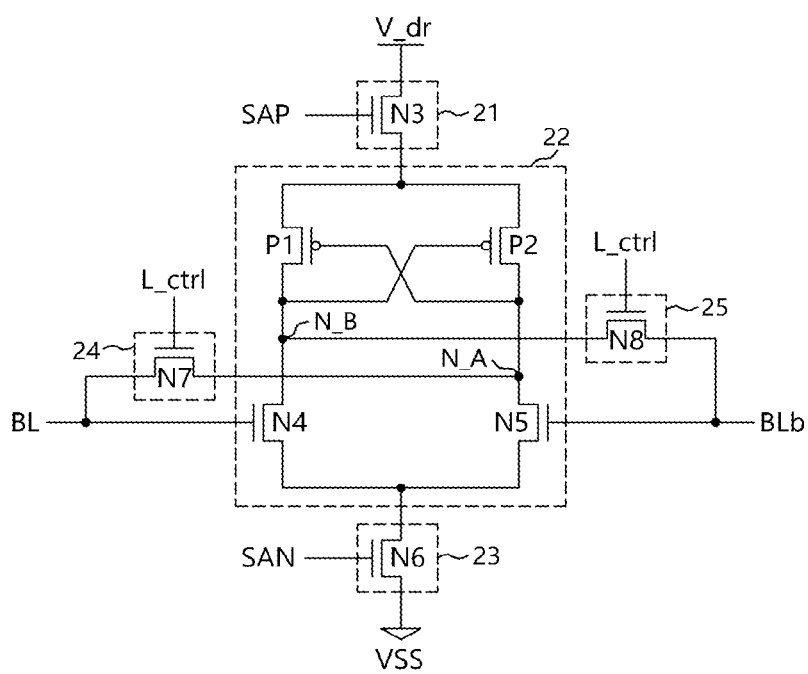
FIG. 2 shows a configuration diagram, in accordance with an embodiment, of a sense amplifier of FIG. 1.

Referring to FIG. 2, the sense amplifier 20 may include a first driving voltage application unit 21, a latch type sense unit 22, a second driving voltage application unit 23, a first latch connection unit 24, and a second latch connection unit 25.

The first driving voltage application unit 21 may provide the latch type sense unit 22 with a driving voltage V_dr in response to the first sense amplifier driving signal SAP. For example, when the first sense amplifier driving signal SAP is enabled, the first driving voltage application unit 21 provides the latch type sense unit 22 with the driving voltage V_dr. When the first sense amplifier driving signal SAP is disabled, the first driving voltage application unit 21 stops providing the driving voltage V_dr to the latch type sense unit 22. For an embodiment, the driving voltage V_dr is an internal voltage generated in the semiconductor memory apparatus 100 and may be a core voltage.

The first driving voltage application unit 21 may include a third transistor N3. The third transistor N3 receives the first sense amplifier driving signal SAP through a gate thereof, receives the driving voltage V_dr through a drain thereof, and is electrically connected to the latch type sense unit 22 through a source thereof.

The latch type sense unit 22 is activated when the driving voltage V_dr and a ground voltage VSS are applied through the first and second driving voltage application units 21 and 23, respectively. The activated latch type sense unit 22 senses and amplifies a voltage level difference between the bit line BL and the bit line bar BLb. When the bit line BL and the bit line bar BLb are electrically connected to first and second latch output nodes N_A and N_B, the latch type sense unit 22 transfers the amplified voltage level to the bit line BL and the bit line bar BLb and substantially maintains the voltage levels of the bit line BL and the bit line bar BLb. Furthermore, when the first and second latch output nodes N_A and N_B are disconnected from the bit line BL and the bit line bar BLb, the latch type sense unit 22 does not amplify the voltage levels of the bit line BL and the bit line bar BLb.

The latch type sense unit 22 may include fourth to seventh transistors N4, N5, P1, and P2. The fourth transistor N4 has a gate electrically connected to the bit line BL, a drain electrically connected to the second latch output node N_B, and a source electrically connected to the second driving voltage application unit 23. The fifth transistor N5 has a gate electrically connected to the bit line bar BLb, a drain electrically connected to the first latch output node N_A, and a source electrically connected to the second driving voltage application unit 23. The sixth transistor P1 has a gate electrically connected to the first latch output node N_A, a source electrically connected to the first driving voltage application unit 21, and a drain electrically connected to the second latch output node N_B. The seventh transistor P2 has a gate electrically connected to the second latch output node N_B, a source electrically connected to the first driving voltage application unit 21, and a drain electrically connected to the first latch output node N_A.

The second driving voltage application unit 23 may provide the ground voltage VSS to the latch type sense unit 22 in response to the second sense amplifier driving signal SAN. For example, when the second sense amplifier driving signal SAN is enabled, the second driving voltage application unit 23 provides the ground voltage VSS to the latch type sense unit 22. When the second sense amplifier driving signal SAN is disabled, the second driving voltage application unit 23 stops providing the ground voltage VSS to the latch type sense unit 22.

The second driving voltage application unit 23 may include an eighth transistor N6. The eighth transistor N6 has a gate that receives the second sense amplifier driving signal SAN, a drain electrically connected to the latch type sense unit 22, and a source that receives the ground voltage VSS.

The first latch connection unit 24 may electrically connect or disconnect the bit line BL to/from the first latch output node N_A in response to the latch control signal L_ctrl. For example, when the latch control signal L_ctrl is disabled, the first latch connection unit 24 electrically connects the bit line BL to the first latch output node N_A. When the latch control signal L_ctrl is enabled, the first latch connection unit 24 disconnects the bit line BL and the first latch output node N_A from each other.

The first latch connection unit 24 may include a ninth transistor N7. The ninth transistor N7 has a gate electrically connected to the latch control signal L_ctrl, and a drain and a source electrically connected to the bit line BL and the first latch output node N_A, respectively.

The second latch connection unit 25 may include a tenth transistor N8. The second latch connection unit 25 may electrically connect or disconnect the bit line bar BLb to/from the second latch output node N_B in response to the latch control signal L_ctrl. For example, when the latch control signal L_ctrl is disabled, the second latch connection unit 25 electrically connects the bit line bar BLb to the second latch output node N_B. When the latch control signal L_ctrl is enabled, the second latch connection unit 25 disconnects the bit line bar BLb and the second latch output node N_B from each other.

Figure 3:
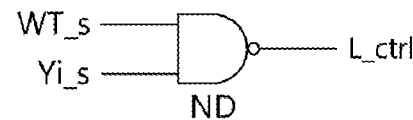
FIG. 3 shows a configuration diagram, in accordance with another embodiment, of a sense amplifier of FIG. 1.

FIG. 3 shows a NAND gate ND, which may be included in the latch control signal generation circuit 40 of FIG. 1. The NAND gate ND receives the write signal WT_s and the column selection signal Yi_s and outputs the latch control signal L_ctrl.

The latch control signal generation circuit 40, configured as indicated above, disables the latch control signal L_ctrl to a high level, regardless of the column selection signal Yi_s, when the write signal WT_s is disabled to a low level. Furthermore, when the write signal WT_s is enabled, the latch control signal generation circuit 40 inverts the column selection signal Yi_s and outputs the inverted signal as the latch control signal L_ctrl. In more detail, in a case where the write signal WT_s is enabled to a high level, the latch control signal generation circuit 40 outputs the latch control signal L_ctrl, which is enabled to a low level, when the column selection signal Yi_s is enabled to a high level. Furthermore, in a case where the write signal WT_s is enabled to a high level, the latch control signal generation circuit 40 outputs the latch control signal L_ctrl, which is disabled to a high level, when the column selection signal Yi_s is disabled to a low level.

Hereinafter, an operation of the semiconductor memory apparatus 100, configured as indicated above in accordance with an embodiment, is described with reference to FIGS. 1, 2, 4A, and 4B.

A case where data is stored in the semiconductor memory apparatus 100 is assumed for a write operation. In the write operation, the write signal WT_s is enabled, and when not in the write operation, the write signal WT_s is disabled.

A description is provided for a case where the semiconductor memory apparatus 100 does not perform the write operation. In this case, the write signal WT_s is disabled.

When the word line WL is enabled, the memory cell 10 is electrically connected to the bit line BL. The memory cell 10 electrically connected to the bit line BL changes the voltage level of the bit line BL according to the level of data stored in the memory cell 10.

Figure 4A:
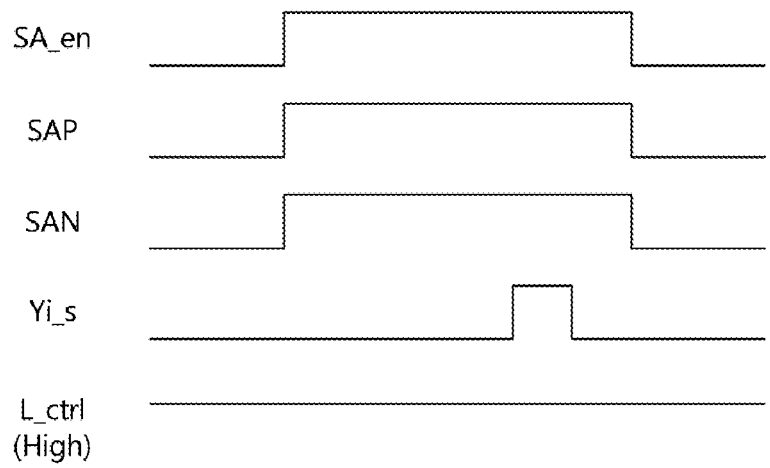
FIG. 4A shows a configuration diagram, in accordance with an embodiment, of a latch control signal generation circuit of FIG. 1.

As illustrated in FIG. 4A, when the sense amplifier enable signal SA_en is enabled to a high level, the sense amplifier driving signal generation circuit 30 outputs the first and second sense amplifier driving signals SAP and SAN enabled to a high level.

When the write signal WT_s is disabled to a low level, the latch control signal generation circuit 40 outputs the latch control signal L_ctrl disabled to a high level regardless of the column selection signal Yi_s.

The enabled first and second sense amplifier driving signals SAP and SAN and the latch control signal L_ctrl disabled to a high level are inputted to the sense amplifier 20.

An operation of the sense amplifier 20 is described with reference to FIG. 2.

The following is a description for the operation of the sense amplifier 20 when the first and second sense amplifier driving signals SAP and SAN are enabled to a high level and the latch control signal L_ctrl is disabled to a high level.

The first driving voltage application unit 21 receives the first sense amplifier driving signal SAP enabled to a high level and provides the latch type sense unit 22 with the driving voltage V_dr.

The second driving voltage application unit 23 receives the second sense amplifier driving signal SAN enabled to a high level and provides the latch type sense unit 22 with the ground voltage VSS.

The latch type sense unit 22 is activated by receiving the driving voltage V_dr and the ground voltage VSS.

The first latch connection unit 24 receives the latch control signal L_ctrl at a high level and electrically connects the bit line BL and the first latch output node N_A to each other.

The second latch connection unit 25 receives the latch control signal L_ctrl at a high level and electrically connects the bit line bar BLb and the second latch output node N_B to each other.

When the voltage level of the bit line BL is higher than that of the bit line bar BLb, the fourth transistor N4 transfers a larger amount of current to the second driving voltage application unit 23 as compared with the fifth transistor N5.

Accordingly, when the voltage level of the bit line BL is higher than that of the bit line bar BLb, the voltage level of the second latch output node N_B is lower than that of the first latch output node N_A.

When the voltage level of the second latch output node N_B is lower than that of the first latch output node N_A, the seventh transistor P2 provides the first latch output node N_A with a larger amount of current as compared with the sixth transistor P1.

When the seventh transistor P2 provides the first latch output node N_A with a larger amount of current as compared with the sixth transistor P1, the voltage level of the first latch output node N_A is higher than that of the second latch output node N_B.

In this case, because a voltage difference occurs between the first and second latch output nodes N_A and N_B through the fourth and fifth transistors N4 and N5 in response to the bit line BL and the bit line bar BLb, the voltage difference between the first and second latch output nodes N_A and N_B is further amplified through the sixth and seventh transistors P1 and P2 in response to the voltage difference between the first and second latch output nodes N_A and N_B.

Furthermore, the first latch output node N_A is electrically connected to the bit line BL by the first latch connection unit 24, and the second latch output node N_B is electrically connected to the bit line bar BLb by the second latch connection unit 25. That is, the voltage difference between the first and second latch output nodes N_A and N_B, which has occurred due to the voltage difference between the bit line BL and the bit line bar BLb, is inputted again as the input of the latch type sense unit 22. When the first and second latch output nodes N_A and N_B are electrically connected to the bit line BL and the bit line bar BLb through the first and second latch connection units 24 and 25, the latch type sense unit 22 has a latch structure in which the voltage difference between the first and second latch output nodes N_A and N_B, which has occurred due to the bit line BL and the bit line bar BLb, causes the voltage difference between the bit line BL and the bit line bar BLb again. Accordingly, the latch type sense unit 22 performs an operation for amplifying and substantially maintaining the voltage difference between the bit line BL and the bit line bar BLb as a latch structure in which the first and second latch output nodes N_A and N_B are electrically connected through the first and second latch connection units 24 and 25.

Next, the following is a description for a case when the semiconductor memory apparatus 100 performs the write operation. The write signal WT_s is enabled.

When the word line WL is enabled, the memory cell 10 is electrically connected to the bit line BL. The memory cell 10 electrically connected to the bit line BL changes the voltage level of the bit line BL according to the level of data stored in the memory cell 10.

Figure 4B:
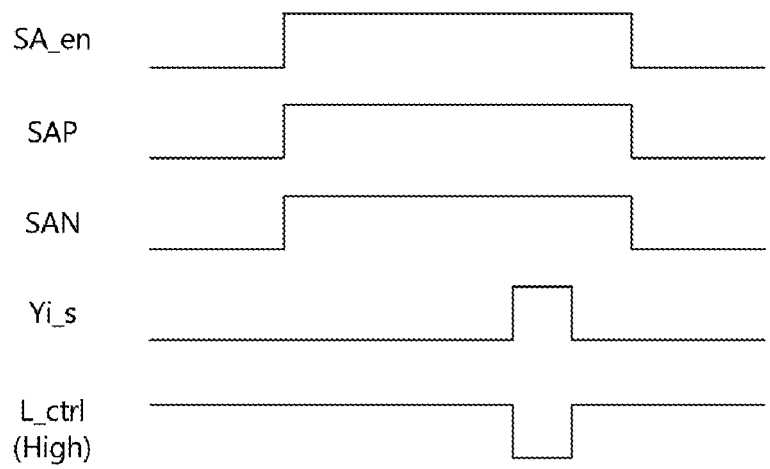
FIG. 4B shows a configuration diagram, in accordance with an embodiment, of a latch control signal generation circuit of FIG. 1

As illustrated in FIG. 4B, when the sense amplifier enable signal SA_en is enabled to a high level, the sense amplifier driving signal generation circuit 30 outputs the first and second sense amplifier driving signals SAP and SAN enabled to a high level.

When the write signal WT_s is enabled to a high level, the latch control signal generation circuit 40 outputs the latch control signal L_ctrl, which is enabled to a low level, in response to the column selection signal Yi_s.

The enabled first and second sense amplifier driving signals SAP and SAN and the latch control signal L_ctrl enabled to a low level are inputted to the sense amplifier 20.

An operation of the sense amplifier 20 is described with reference to FIG. 2.

The following is a description for the operation of the sense amplifier 20 when the first and second sense amplifier driving signals SAP and SAN are enabled to a high level and the latch control signal L_ctrl is enabled to a low level.

The first driving voltage application unit 21 receives the first sense amplifier driving signal SAP enabled to a high level and provides the latch type sense unit 22 with the driving voltage V_dr.

The second driving voltage application unit 23 receives the second sense amplifier driving signal SAN enabled to a high level and provides the latch type sense unit 22 with the ground voltage VSS.

The latch type sense unit 22 is activated by receiving the driving voltage V_dr and the ground voltage VSS.

The first latch connection unit 24 disconnects the bit line BL and the first latch output node N_A from each other only in the enable period of the latch control signal L_ctrl enabled to a low level, and electrically connects the bit line BL and the first latch output node N_A to each other in another period (the disable period) of the latch control signal L_ctrl.

The second latch connection unit 25 disconnects the bit line bar BLb and the second latch output node N_B from each other only in the enable period of the latch control signal L_ctrl enabled to a low level, and electrically connects the bit line bar BLb and the second latch output node N_B to each other in another period (the disable period) of the latch control signal L_ctrl.

If the voltage level of the bit line BL is higher than that of the bit line bar BLb, then the fourth transistor N4 transfers a larger amount of current to the second driving voltage application unit 23 as compared with the fifth transistor N5.

Accordingly, when the voltage level of the bit line BL is higher than that of the bit line bar BLb, the voltage level of the second latch output node N_B is lower than that of the first latch output node N_A.

When the voltage level of the second latch output node N_B is lower than that of the first latch output node N_A, the seventh transistor P2 provides the first latch output node N_A with a larger amount of current as compared with the sixth transistor P1.

When the seventh transistor P2 provides the first latch output node N_A with a larger amount of current as compared with the sixth transistor P1, the voltage level of the first latch output node N_A is higher than that of the second latch output node N_B.

In this case, because a voltage difference occurs between the first and second latch output nodes N_A and N_B through the fourth and fifth transistors N4 and N5 in response to the bit line BL and the bit line bar BLb, the voltage difference between the first and second latch output nodes N_A and N_B is further amplified through the sixth and seventh transistors P1 and P2 in response to the voltage difference between the first and second latch output nodes N_A and N_B.

Furthermore, in the disable period of the latch control signal L_ctrl, the first latch connection unit 24 electrically connects the first latch output node N_A and the bit line BL to each other. Only in the enable period of the latch control signal L_ctrl, the first latch connection unit 24 disconnects the first latch output node N_A and the bit line BL from each other. In the disable period of the latch control signal L_ctrl, the second latch connection unit 25 electrically connects the second latch output node N_B and the bit line bar BLb to each other. Only in the enable period of the latch control signal L_ctrl, the second latch connection unit 25 disconnects the second latch output node N_B and the bit line bar BLb from each other.

In the disable period of the latch control signal L_ctrl, the voltage difference between the first and second latch output nodes N_A and N_B, which has occurred due to the voltage difference between the bit line BL and the bit line bar BLb, is inputted again as the input of the latch type sense unit 22. When the first and second latch output nodes N_A and N_B are electrically connected to the bit line BL and the bit line bar BLb through the first and second latch connection units 24 and 25, the latch type sense unit 22 has a latch structure in which the voltage difference between the first and second latch output nodes N_A and N_B, which occurs due to the bit line BL and the bit line bar BLb, causes the voltage difference between the bit line BL and the bit line bar BLb again. Accordingly, during the disable period of the latch control signal L_ctrl, the latch type sense unit 22 performs an operation for amplifying and substantially maintaining the voltage difference between the bit line BL and the bit line bar BLb as a latch structure in which the first and second latch output nodes N_A and N_B are electrically connected through the first and second latch connection units 24 and 25.

However, during the enable period of the latch control signal L_ctrl, because the first and second latch output nodes N_A and N_B are disconnected from the bit line BL and the bit line bar BLb, the latch type sense unit 22 does not perform an operation for amplifying and substantially maintaining the voltage difference between the bit line BL and the bit line bar BLb.

Referring to FIG. 1, in the write operation, the column selection signal Yi_s is a signal that electrically connects or disconnects the data line Data_L and the data line bar Datab_L to/from the bit line BL and the bit line bar BLb, respectively.

In the write operation, when the column selection signal Yi_s is enabled, data is transferred to the bit line BL and the bit line bar BLb through the data line Data_L and the data line bar Datab_L, respectively. When the column selection signal Yi_s is enabled and the data is transferred to the bit line BL and the bit line bar BLb, the latch type sense unit 22 of the sense amplifier 20 is in a state of being disconnected from the bit line BL and the bit line bar BLb. Accordingly, data is not transferred to the bit line BL and the bit line bar BLb sensed and amplified/maintained by the sense amplifier 20, but data is transferred to the bit line BL and the bit line bar BLb not affected by the sense amplifier 20, so that it is possible to increase a data transfer speed to the bit line BL and the bit line bar BLb and to reduce power consumed for transferring the data.

According the semiconductor memory apparatus 100 in accordance with an embodiment, in the write operation, when data is transferred to the bit line through the data line, it operates such that the bit line is not affected by the sense amplifier, so that it is possible to improve a data transfer speed to the bit line through the data line and to reduce current or power consumed for data transfer.

Figure 5:
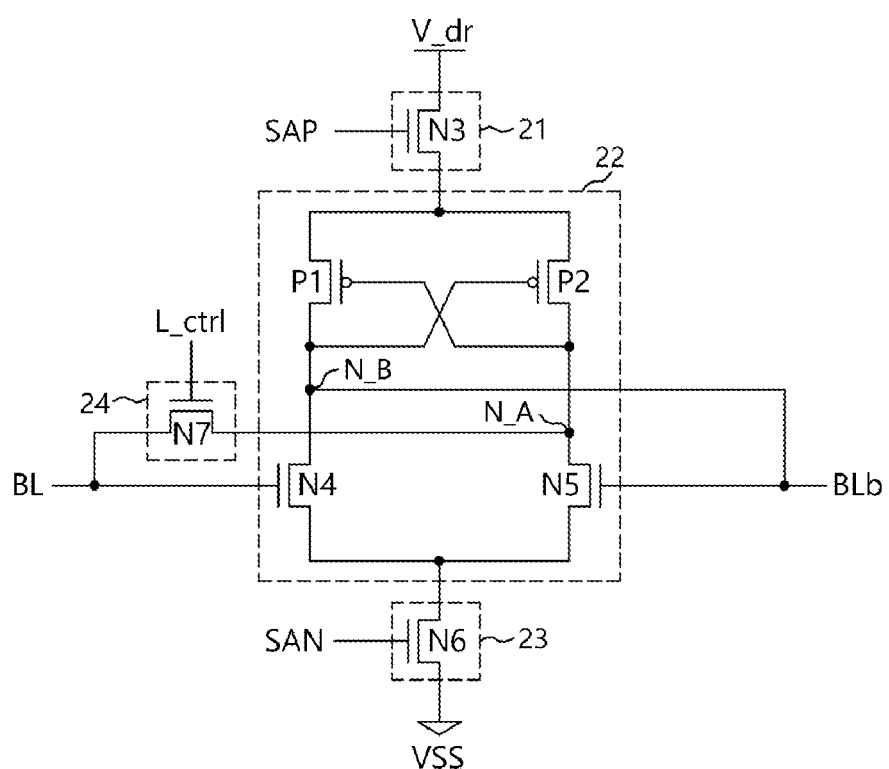
FIG. 5 shows a timing diagram of a semiconductor memory apparatus, in accordance with an embodiment.

For an embodiment, the sense amplifier 20 of FIG. 1 may be configured as illustrated in FIG. 5, different from the configuration of the sense amplifier 20 illustrated in FIG. 2.

Referring to FIG. 5, the sense amplifier 20 may include the first driving voltage application unit 21, the latch type sense unit 22, the second driving voltage application unit 23, and the first latch connection unit 24.

The first driving voltage application unit 21 may provide the latch type sense unit 22 with the driving voltage V_dr in response to the first sense amplifier driving signal SAP. For example, when the first sense amplifier driving signal SAP is enabled, the first driving voltage application unit 21 provides the latch type sense unit 22 with the driving voltage V_dr. When the first sense amplifier driving signal SAP is disabled, the first driving voltage application unit 21 stops providing the driving voltage V_dr to the latch type sense unit 22. For an embodiment, the driving voltage V_dr is an internal voltage generated in the semiconductor memory apparatus 100 and may be a core voltage.

The first driving voltage application unit 21 may include the third transistor N3. The third transistor N3 receives the first sense amplifier driving signal SAP through a gate thereof, receives the driving voltage V_dr through a drain thereof, and is electrically connected to the latch type sense unit 22 through a source thereof.

The latch type sense unit 22 is activated when the driving voltage V_dr and a ground voltage VSS are applied through the first and second driving voltage application units 21 and 23, respectively. The activated latch type sense unit 22 senses and amplifies a voltage level difference between the bit line BL and a bit line bar BLb. When the bit line BL is electrically connected to the first latch output node N_A, the latch type sense unit 22 transfers the amplified voltage level to the bit line BL and the bit line bar BLb and substantially maintains the voltage levels of the bit line BL and the bit line bar BLb. Furthermore, when the first latch output node N_A is disconnected from the bit line BL and the bit line bar BLb, the latch type sense unit 22 does not amplify the voltage levels of the bit line BL and the bit line bar BLb.

The latch type sense unit 22 may include the fourth to seventh transistors N4, N5, P1, and P2. The fourth transistor N4 has a gate electrically connected to the bit line BL, a drain electrically connected to the second latch output node N_B, and a source electrically connected to the second driving voltage application unit 23. The fifth transistor N5 has a gate electrically connected to the bit line bar BLb, a drain electrically connected to the first latch output node N_A, and a source electrically connected to the second driving voltage application unit 23. The sixth transistor P1 has a gate electrically connected to the first latch output node N_A, a source electrically connected to the first driving voltage application unit 21, and a drain electrically connected to the second latch output node N_B. The seventh transistor P2 has a gate electrically connected to the second latch output node N_B, a source electrically connected to the first driving voltage application unit 21, and a drain electrically connected to the first latch output node N_A. The bit line bar BLb is electrically connected to the second latch output node N_B.

The second driving voltage application unit 23 may provide the ground voltage VSS to the latch type sense unit 22 in response to the second sense amplifier driving signal SAN. For example, when the second sense amplifier driving signal SAN is enabled, the second driving voltage application unit 23 provides the ground voltage VSS to the latch type sense unit 22. When the second sense amplifier driving signal SAN is disabled, the second driving voltage application unit 23 stops providing the ground voltage VSS to the latch type sense unit 22.

The second driving voltage application unit 23 may include the eighth transistor N6. The eighth transistor N6 has a gate that receives the second sense amplifier driving signal SAN, a drain electrically connected to the latch type sense unit 22, and a source that receives the ground voltage VSS.

The first latch connection unit 24 may electrically connect or disconnect the bit line BL to/from the first latch output node N_A in response to the latch control signal L_ctrl. For example, when the latch control signal L_ctrl is disabled, the first latch connection unit 24 electrically connects the bit line BL to the first latch output node N_A. When the latch control signal L_ctrl is enabled, the first latch connection unit 24 disconnects the bit line BL and the first latch output node N_A from each other.

The first latch connection unit 24 may include the ninth transistor N7. The ninth transistor N7 has a gate electrically connected to the latch control signal L_ctrl, and a drain and a source electrically connected to the bit line BL and the first latch output node N_A, respectively.

When the latch control signal L_ctrl is disabled, the sense amplifier 20 illustrated in FIG. 5 operates as described above in the same manner as that of the sense amplifier 20 illustrated in FIG. 2. That is, when the latch control signal L_ctrl is disabled, the first and second latch output nodes N_A and N_B are electrically connected to the bit line BL and the bit line bar BLb, respectively, so that the sense amplifier 20 senses and amplifies a voltage difference between the bit line BL and the bit line bar BLb and substantially maintains the voltage levels of the bit line BL and the bit line bar BLb.

When the latch control signal L_ctrl is enabled, because the bit line BL is disconnected from the first latch output node N_A, the combination of the latch type sense unit 22 and the first latch connection unit 24 of the sense amplifier 20 of FIG. 5 does not have a latch structure.

In the write operation, when the column selection signal Yi_s is enabled, data is transferred to the bit line BL and the bit line bar BLb through the data line Data_L and the data line bar Datab_L, respectively. When the column selection signal Yi_s is enabled and the data is transferred to the bit line BL and the bit line bar BLb, the combination of the latch type sense unit 22 and the first latch connection unit 24 of the sense amplifier 20 is not a latch structure. Accordingly, data is not transferred to the bit line BL and the bit line bar BLb sensed and amplified/maintained by the sense amplifier 20, but data is transferred to the bit line BL and the bit line bar BLb, of which voltage levels are not substantially maintained by the sense amplifier 20, so that it is possible to increase a data transfer speed to the bit line BL and the bit line bar BLb and to reduce power consumed for transferring the data.

According to the semiconductor memory apparatus 100 in accordance with an embodiment, in the write operation, when data is transferred to the bit line BL through the data line Data_L, it operates such that the bit line BL is not affected by the sense amplifier 20, so that it is possible to improve a data transfer speed to the bit line BL through the data line Data_L and to reduce current or power consumed for data transfer.

While various embodiments have been described above, it will be understood to those skilled in the art that the described embodiments represent only a limited number of possible embodiments consistent with the claims presented below. Accordingly, the sense amplifier 20 and the semiconductor memory apparatus 100 including the sense amplifier 20, as described herein, should not be limited based on the described embodiments.

What is claimed is:

1. A semiconductor memory apparatus comprising:
   a latch type sense unit configured to detect a voltage difference between a bit line and a bit line bar for causing a voltage difference between a first latch output node and a second latch output node;
   a first latch connection unit configured to electrically connect the bit line to the first latch output node when a latch control signal is disabled and disconnect the bit line from the first latch output node when the latch control signal is enabled, and
   a latch control signal generation circuit configured to generate the latch control signal in response to a column selection signal and a write signal.

2. The semiconductor memory apparatus according to claim 1, further comprising:

a second latch connection unit configured to electrically connect the bit line bar to the second latch output node when the latch control signal is disabled and disconnect the bit line bar from the second latch output node when the latch control signal is enabled.

3. The semiconductor memory apparatus according to claim 1, wherein the second latch output node is electrically connected to the bit line bar.

4. The semiconductor memory apparatus according to claim 3, wherein the latch type sense unit comprises:
   a first transistor having a gate electrically connected to the bit line and a drain electrically connected to the second latch output node;
   a second transistor having a gate electrically connected to the bit line bar and a drain electrically connected to the first latch output node;
   a third transistor having a gate electrically connected to the first latch output node and a drain electrically connected to the second latch output node; and
   a fourth transistor having a gate electrically connected to the second latch output node and a drain electrically connected to the first latch output node.

5. The semiconductor memory apparatus according to claim 4, further comprising:
   a first driving voltage application unit configured to provide a driving voltage to each source of the third and fourth transistors; and
   a second driving voltage application unit configured to provide a ground voltage to each source of the first and second transistors.

6. The semiconductor memory apparatus according to claim 2, wherein the latch type sense unit comprises:
   a first transistor having a gate electrically connected to the bit line and a drain electrically connected to the second latch output node;
   a second transistor having a gate electrically connected to the bit line bar and a drain electrically connected to the first latch output node;
   a third transistor having a gate electrically connected to the first latch output node and a drain electrically connected to the second latch output node; and
   a fourth transistor having a gate electrically connected to the second latch output node and a drain electrically connected to the first latch output node.

7. The semiconductor memory apparatus according to claim 6, further comprising:
   a first driving voltage application unit configured to provide a driving voltage to each source of the third and fourth transistors; and
   a second driving voltage application unit configured to provide a ground voltage to each source of the first and second transistors.

8. A semiconductor memory apparatus comprising:
   a sense amplifier configured to amplify a voltage level of a bit line when a latch control signal is disabled and prevent the voltage level of the bit line from being amplified when the latch control signal is enabled; and
   a latch control signal generation circuit configured to generate the latch control signal in response to a column selection signal and a write signal.

9. The semiconductor memory apparatus according to claim 8, wherein the latch control signal generation circuit is configured to:
   disable the latch control signal, regardless of the column selection signal, when the write signal is disabled, and
   generate the latch control signal, in response to the column selection signal, when the write signal is enabled.

10. The semiconductor memory apparatus according to claim 9, wherein the latch control signal generation circuit is configured to generate the latch control signal when the write signal is enabled and the column selection signal is enabled.

11. The semiconductor memory apparatus according to claim 9, wherein the latch control signal generation circuit is configured to invert the column selection signal when the write signal is enabled and output the inverted signal as the latch control signal.

12. The semiconductor memory apparatus according to claim 9, wherein the sense amplifier comprises:
    a latch type sense unit configured to amplify a voltage level of a latch output node according to the voltage level of the bit line; and
    a latch connection unit configured to electrically connect the latch output node to the bit line when the latch control signal is disabled and disconnect the latch output node from the bit line when the latch control signal is enabled.

13. The semiconductor memory apparatus according to claim 12, wherein, when the latch control signal is disabled, the sense amplifier has a latch structure which is composed of the latch type sense unit and the latch connection unit,
    wherein the bit line provides input to the latch type sense unit,
    wherein the latch output node passes output from the latch type sense unit.

14. The semiconductor memory apparatus according to claim 13, wherein, when the latch control signal is enabled, the sense amplifier is prevented from having the latch structure.

15. The semiconductor memory apparatus according to claim 8, further comprising:
    a first line connection switch configured to electrically connect a data line to the bit line in response to the column selection signal.

16. The semiconductor memory apparatus according to claim 15, wherein the first line connection switch electrically connects the data line to the bit line when the column selection signal is enabled, and wherein the line connection switch electrically disconnects the data line from the bit line when the column selection signal is disabled.

17. The semiconductor memory apparatus according to claim 15, further comprising:
    a second line connection switch configured to electrically connect a data line bar to the bit line bar in response to the column selection signal.

18. The semiconductor memory apparatus according to claim 17, wherein the second line connection switch electrically connects the data line bar to the bit line bar when the column selection signal is enabled, and wherein the second line connection switch electrically disconnects the data line bar from the bit line bar when the column selection signal is disabled.

* * * * *